(12) United States Patent
Ivanov et al.

(10) Patent No.: US 8,064,243 B2
(45) Date of Patent: Nov. 22, 2011

(54) METHOD AND APPARATUS FOR AN INTEGRATED CIRCUIT WITH PROGRAMMABLE MEMORY CELLS, DATA SYSTEM

(75) Inventors: Milena Ivanov, Unterhaching (DE); Heinz Hoenigschmid, Poecking (DE); Stefan Dietrich, Tuerkenfeld (DE)

(73) Assignee: Qimonda AG, Munich (DE)

( * ) Notice: Subject to any disclaimer, the term of this patent is extended or adjusted under 35 U.S.C. 154(b) by 776 days.

(21) Appl. No.: 11/939,501

(22) Filed: Nov. 13, 2007

(65) Prior Publication Data

US 2009/0122586 A1 May 14, 2009

(51) Int. Cl.
*G11C 11/00* (2006.01)

(52) U.S. Cl. ......... 365/148; 365/100; 365/163; 977/754

(58) Field of Classification Search ................ 365/100, 365/107, 148, 150, 153, 157, 158, 163, 178, 365/182, 127, 185.03, 185.19, 185.29, 201; 257/2–5, 52–70, 202, 211, 246, 247, 248, 257/257, 298, 350, 359, 379, 536, 758, 762, 257/930, E21.35, E21.591, E23.151, E27.004, 257/E29.003, E29.33, E31.047, E45.002; 438/104, 675, 768, 800, 95, 622, 98, 900, 438/930, 685, 763; 29/25.01; 136/258; 148/DIG. 1; 204/192.25; 324/158.1, 73.1; 361/525, 528; 427/58; 977/810, 831, 943

See application file for complete search history.

(56) References Cited

U.S. PATENT DOCUMENTS

| | | | | |
|---|---|---|---|---|
| 5,761,115 A | * | 6/1998 | Kozicki et al. | 365/182 |
| 5,896,312 A | * | 4/1999 | Kozicki et al. | 365/153 |
| 5,914,893 A | * | 6/1999 | Kozicki et al. | 365/107 |
| 6,084,796 A | * | 7/2000 | Kozicki et al. | 365/153 |
| 6,418,049 B1 | * | 7/2002 | Kozicki et al. | 365/174 |
| 6,487,106 B1 | * | 11/2002 | Kozicki | 365/153 |
| 6,825,489 B2 | * | 11/2004 | Kozicki | 257/42 |
| 6,865,117 B2 | * | 3/2005 | Kozicki | 365/189.09 |
| 7,068,533 B2 | * | 6/2006 | Ferrant et al. | 365/158 |
| 7,169,635 B2 | * | 1/2007 | Kozicki | 438/95 |
| 7,212,432 B2 | * | 5/2007 | Ferrant et al. | 365/158 |
| 7,288,781 B2 | * | 10/2007 | Kozicki | 257/4 |
| 7,294,875 B2 | * | 11/2007 | Kozicki | 257/243 |
| 2002/0168820 A1 | * | 11/2002 | Kozicki et al. | 438/259 |
| 2003/0137869 A1 | * | 7/2003 | Kozicki | 365/158 |
| 2003/0185036 A1 | | 10/2003 | Gilton et al. | |

(Continued)

FOREIGN PATENT DOCUMENTS

DE   10 2004 040 753   3/2006

(Continued)

*Primary Examiner* — Richard Elms
*Assistant Examiner* — Harry W Byrne
(74) *Attorney, Agent, or Firm* — Patterson & Sheridan, LLP

(57) ABSTRACT

A method and apparatus for an integrated circuit with programmable memory cells which are arranged between a first and a second conductor for supplying first and second voltage is provided. A control circuit is arranged between the memory cells and the second conductor. The control circuit controls a change time during which at least one of the memory cells is supplied with a changing current from the second supply changing a state of the memory cell. The control circuit senses the state of the memory cell and stops the erasing current when the memory cell is in a changed state. Furthermore an embodiment refers to a data system with a programmable memory and a method of operating an integrated circuit. Another embodiment refers to a method of operating an integrated circuit.

22 Claims, 7 Drawing Sheets

U.S. PATENT DOCUMENTS

| | | |
|---|---|---|
| 2004/0264234 A1 | 12/2004 | Moore et al. |
| 2006/0109708 A1* | 5/2006 | Pinnow et al. ................. 365/163 |
| 2006/0164880 A1 | 7/2006 | Sakamoto et al. |
| 2006/0187701 A1 | 8/2006 | Liaw |
| 2006/0203430 A1* | 9/2006 | Pinnow et al. ................. 361/528 |
| 2006/0221555 A1* | 10/2006 | Pinnow ......................... 361/525 |
| 2006/0279328 A1* | 12/2006 | Kozicki et al. .................. 326/41 |
| 2007/0091667 A1* | 4/2007 | Rohr et al. ..................... 365/148 |
| 2007/0274120 A1* | 11/2007 | Pinnow et al. ................. 365/148 |
| 2008/0006812 A1* | 1/2008 | Kozicki et al. ..................... 257/4 |

FOREIGN PATENT DOCUMENTS

DE     11 2004 000 060     6/2006

* cited by examiner

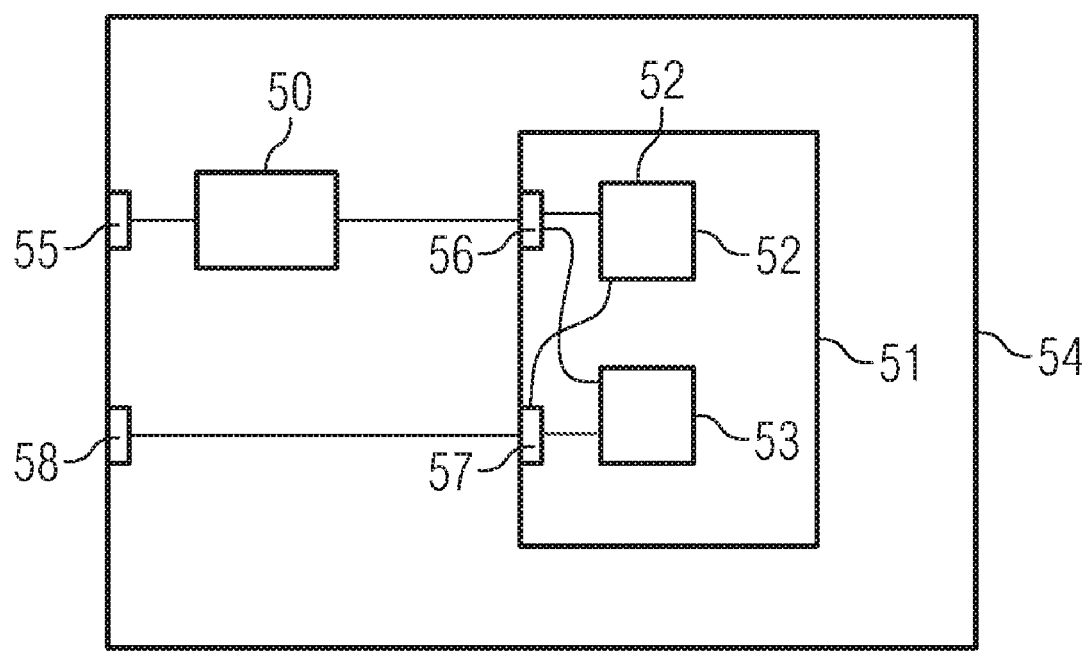

METHOD AND APPARATUS FOR AN INTEGRATED CIRCUIT WITH PROGRAMMABLE MEMORY CELLS, DATA SYSTEM

BACKGROUND OF THE INVENTION

The invention relates to an integrated circuit with programmable memory cells and to a data system with an integrated circuit.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 depicts a schematic view of a data system according to one embodiment;

DETAILED DESCRIPTION OF THE PREFERRED EMBODIMENT

Figure 1:
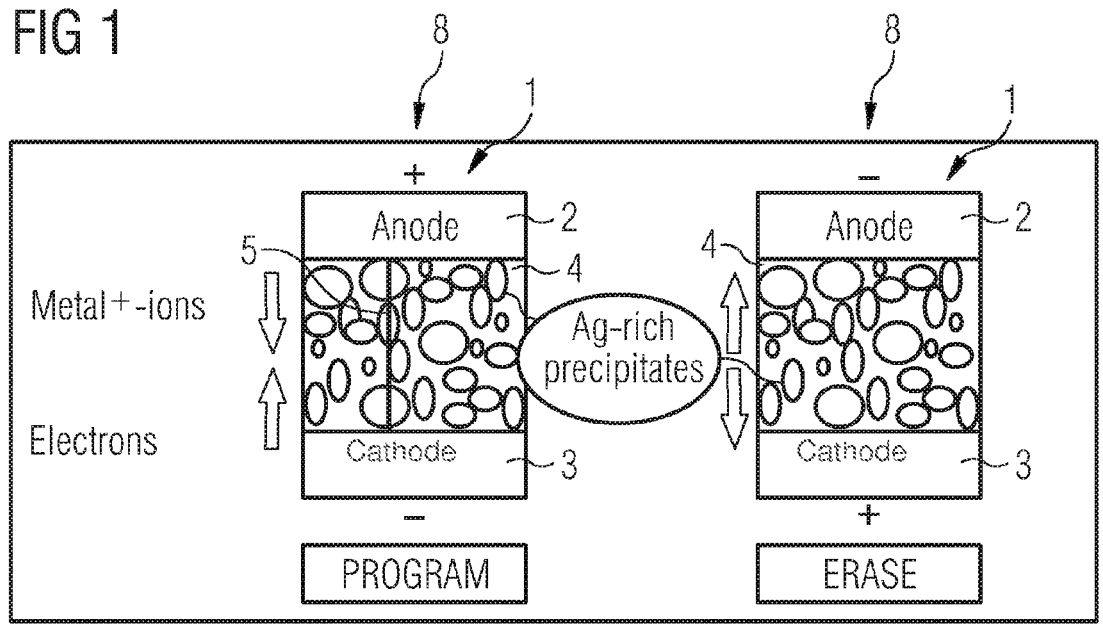
FIG. 1 illustrates a schematic view of a programming and an erasing process of a memory cell according to one embodiment.

FIG. 1 depicts a memory element of a memory cell 1 with an anode 2, a cathode 3 and a programmable layer 4 in between in two different programming states according to one embodiment. In the left figure, a process state is illustrated during which a data is programmed in the memory cell 1. The memory cell is for example embodied as a programmable metallization memory cell with the programmable layer 4 that can be switched by a positive voltage at the anode referred to the cathode from a high resistant state to a low resistant, a current state. Depending on the embodiment, any other type of programmable memory cell, for example a resistive memory cell may be used. The programmable memory cell may be a programmable metallization cell that can be switched from a high resistance state to a low resistant state. The programmable layer may comprise chalcogenite glasses with up to many tens of atomic percent of silver to form ternary compounds that act as high ion mobility solid electrolytes. The anode 2 that is in direct contact with the programmable layer 4 may comprise oxidizable silver. The cathode 3 may be made from an inert material. With an applied bias of a few hundred millivolts, the silver ions are reduced at the cathode 3 and the silver in the anode 2 is oxidized. The result of this electrochemical reaction is a rapid formation of a stable conducting electrodeposit extending from the cathode 3 to the anode 2. During the process silver is dissolved in the chalcogenite material of the programmable layer 4, forming ternary compounds that act as high ion mobility solid electrolytes. A line acts as a conducting link 5 between the cathode 3 and the anode 2, and hence the resistance of the memory cell can be altered by many orders of magnitude via this non-volatile electrically-stimulated deposition process. This programming process is depicted at the left side of FIG. 1.

A reverse bias voltage may cause dispersion of the conducting link, returning the memory cell to a high resistance state. Therefore, a write-erase cycle can be repeated many times. At it is seen in the right figure of FIG. 1 a negative voltage is applied to the anode 2 referred to the cathode 3. The negative voltage at the anode 2 dissolves the conducting link 5 and transfers the state of the memory cell 1 to a higher resistance state. The programmable layer 4 can be made of any amorphous material that can incorporate amounts of metal and behave as a solid electrolyte. Under appropriate bias conditions, the metal ions in the electrolyte can be reduced to form a conducting link 5 through the material, and this process can easily be reversed to recreate the insulating amorphous layer. Therefore, the programmable layer 4 may be made of other materials that provide the discussed solid electrolyte behavior.

Figure 2:
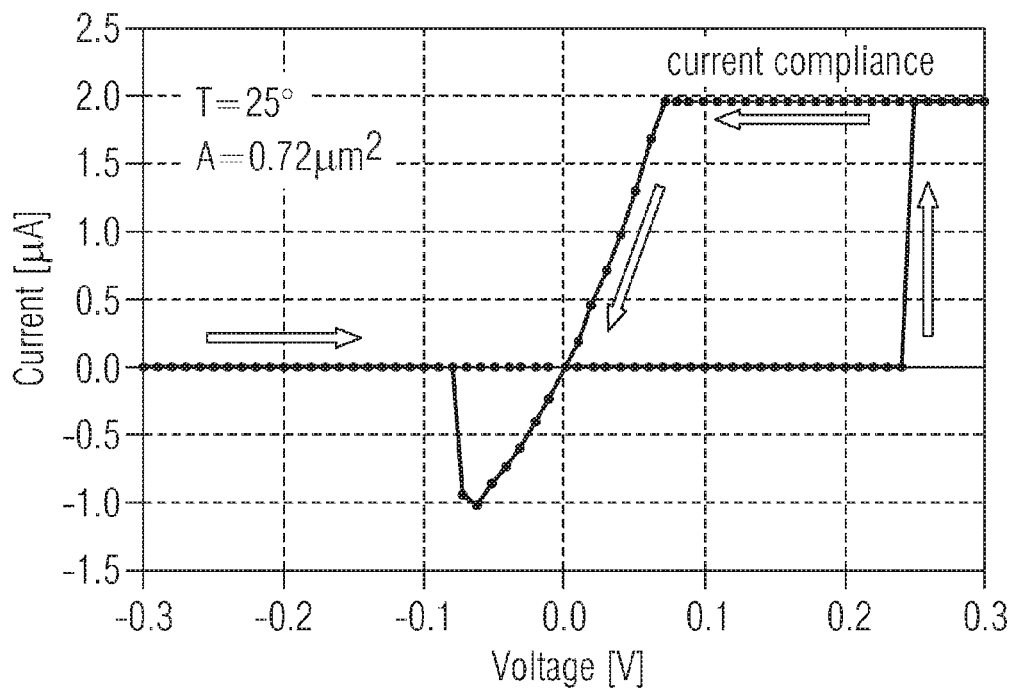
FIG. 2 illustrates a current versus voltage diagram of a memory cell according to one embodiment.

FIG. 2 illustrates a characteristic electric line of a programmable memory cell, whereby the voltage that is applied between the anode 2 and the cathode 3 is depicted along the X-coordinate, and the current that flows with the applied voltage is depicted along the Y-coordinate according to one embodiment. As it may be seen from FIG. 2, the memory cell 1 is switched in a current state with a voltage of more than 240 mV. The program state of a memory cell may be sensed by applying a voltage between 0.1 and 0.2 V. If the memory cell 1 is in a program state, then a current flows with a value of about 2.0 µA. If the memory cell 1 is in an erased state, which may be a state with a high resistance, then nearly no current flows through the memory cell. The programmable state of the memory cell may be erased by applying a negative voltage of about 80 mV at the anode 2 referred to the cathode 3. By applying a voltage of −80 mV or more, the memory cell 1 is transferred from a low resistance state to a high resistance state.

Figure 3:
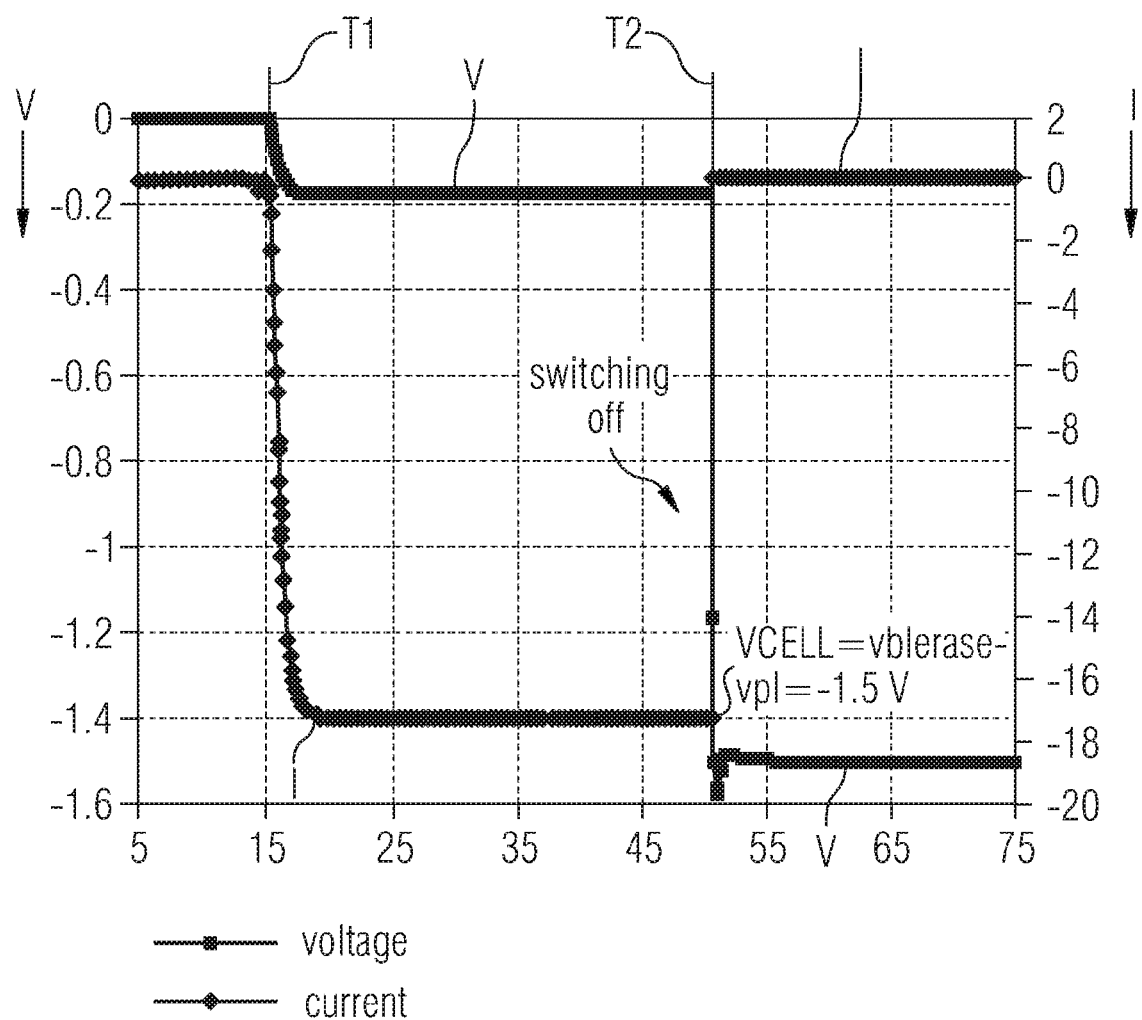
FIG. 3 depicts a diagram of a current and a voltage during an erasing process according to one embodiment.

FIG. 3 depicts a schematic timing diagram of a current I and a voltage V of an erasing process of a memory cell 1 according to one embodiment. At a first time point T1, a negative voltage of about −150 mV is applied to the anode 2 referring to the cathode 3. By applying the negative erasing voltage at the first time point T1, a negative current I starts. At a second time point T2, the conductive linking is removed and the current I is reduced abruptly to zero. At the second time point T2 the negative voltage between the anode 2 and the cathode 3 falls abruptly to −1.5 V, which corresponds to the voltage difference between a plate voltage VPL that is applied to the anode 2, and an erase voltage VPLerase that is applied to the cathode 3. After the second time point T2 the memory cell is in an erased state.

Figure 4:
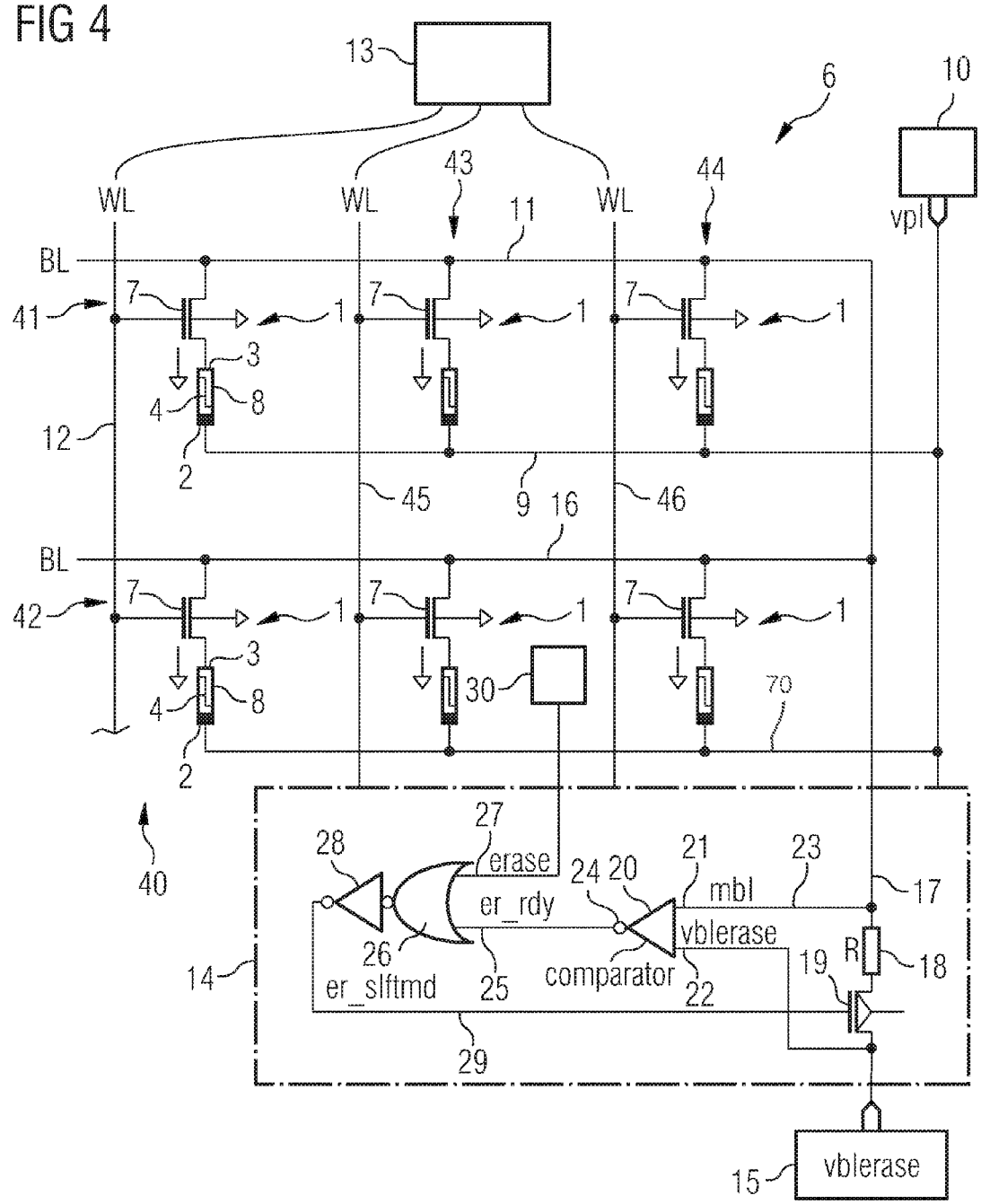
FIG. 4 depicts a partial view of a memory circuit according to one embodiment.

FIG. 4 depicts a schematic partial view of an integrated circuit 6 that is embodied as a memory circuit with several memory cells 1 according to one embodiment. The integrated circuit may be a memory device, for example a dynamic random access memory (DRAM). Each of the memory cells 1 comprises a switch 7 and a memory element 8 with an anode 2, a cathode 3 and a programmable layer 4 in between as explained in FIG. 1. The anode 2 is connected by a first conducting line 9 with a first conductor supplying a first electrical supply 10. The switch 7 is disposed between the cathode 3 and a second conducting line 11. The switch 7 is connected via a control input with a select line 12. The select line 12 is connected with a select unit 13.

The memory cell 1 is therefore connected via the switch 7 with the first conductor, which is connected with the first supply 10 and via the control circuit 14 with a second conductor which is connected with the second supply 15. The first supply 10 delivers a first electrical potential, i.e. a first voltage, to the anode 2 of the memory cell 1. The second supply 15 delivers a second electrical potential, i.e. a second voltage. Depending on the switching position of the switch 7 the cathode 3 is connected with or disconnected from the second conducting line 11. If the switch 7 is controlled by a select signal on the select line 12 in a closed position, then the second conducting line 11 is electrically connected with the cathode 3. Depending on the embodiment, several types of switches may be used, for example a transistor may be used as a switch 7.

In the depicted embodiment, several memory cells 1 are arranged in rows 40, 43, 44 and columns 41, 42, whereby the switches 7 of the memory cells 1 of one row 40, 43, 44 are connected via control inputs with one select line 12, 45, 46. Furthermore the memory cells 1 of a first column 41 are electrically connected via the switches 7 with one second conducting line 11. The memory cells of the second column 42 are electrically connected via switches 7 with a further conducting line 16. The anodes 2 of the memory elements 8 of the memory cells 1 of the second column 42 are connected with a third conducting line 70 that is connected with the first supply 10. The second conducting line 11 and the further conducting line 16 are connected with a common line 17 that is connected with the control circuit 14. In the depicted embodiment, the control circuit 14 comprises a sense resistor 18 that is connected with the common line 17 and via the further switch 19 with the second supply 15. The further switch 19 may be for example embodied as a transistor. The control circuit 14 comprises a first comparator 20 with a first and a second input 21, 22. The first input 21 is electrically connected by a sense line 23 with the common line 17. An output 24 of the first comparator 20 is connected with a third input 25 of a second comparator 26. The second comparator 26 comprises a fourth input 27, to which an erase signal is supplied by a further control circuit 30. An output of the second comparator 26 is connected with an input of an amplifier 28. An output of the amplifier 28 is connected via a second control line 29 with a control input of the further switch 19.

The second input 22 of the first comparator 20 may be electrically connected with the second supply 15 delivering a second voltage that is provided by the second supply 15.

In the following, the function of the integrated circuit 6 is explained for an erasing process. If a predetermined memory cell 1 may be erased, then the select unit 13 delivers a select signal on the select line 12 that is electrically connected with a control input of the switch 7 of the predetermined memory cell 1. The select signal puts the switch 7 from an open to a closed state. In an open state of the switch 7, the cathode 3 is disconnected from the second conducting line 11. In a closed state of the switch 7, the cathode 3 of the predetermined memory cell 1 is electrically connected with the second conducting line 11.

Furthermore, an erase signal is delivered by the further control circuit 30 to the fourth input 27 of the second comparator 26. The first supply 10 provides a lower voltage compared to the second supply 15. Furthermore the further switch 19 is in a closed position electrically connecting the second supply 15 via the sense resistor 18 with the common line 17 and the second and further conducting lines 11, 16. The erase signal is generated by the further control circuit 30 and the time duration of the erase signal is also controlled by the further control circuit 30. The erase signal is for example a low voltage signal.

If the predetermined memory cell 1 is in a program state with a low resistance, then a current flows from the second supply 15 via the further switch 19 and the sense resistor 18, the common line 17 and the second conducting line 11, the switch 7 and the predetermined memory cell 1 and a first conducting line 9 to the first supply 10. The current generates a voltage drop at the sense resistor 18 that generates a voltage difference between the first and the second signal input 21, 22 of the first comparator 20. The comparator 20 outputs a low voltage signal if the voltages on the first and second input 21, 22 have a predetermined difference. The comparator 20 outputs a high voltage signal if the voltages on the first and second input return to a nearly equal or equal value. This means that the output 24 of the comparator 20 stays in this situation on a predetermined level, in this embodiment on a low voltage level. The second comparator 26 may be embodied as a logical gate that puts out a high voltage signal to the amplifier 28 if the third and the fourth input 25, 27 show a low voltage signal. The output of the second comparator 26 is amplified by the amplifier 28 and delivered via the second control line 29 to the control input of the further switch 19. If the third and the fourth input 25, 27 of the second comparator 26 are on the same voltage level, then the switch 19 is controlled by the control signal in a current state electrically connecting the second supply 15 with the sense resistor 18. As long as the output 24 of the first comparator 20 indicates a current through the sense resistor 18 that generates a voltage difference between the second supply 15 and the common line 17, then the further switch 19 remains in a conducting position and the erasing process of the predetermined memory cell is continuing.

If the predetermined memory cell changes to a high resistance state, then the current via the sense resistor 18 decreases and the voltage on the common line 17 and the voltage of the second supply 15 became equal or at least the voltage difference is reduced to a lower value. If nearly the same voltage is delivered on the first and the second input 21, 22 of the comparator 20, then the voltage signal on the output 24 changes from a low to a high voltage level. The high voltage level of the output signal is detected by the second comparator 26 and the output signal of the second comparator 26 changes. The amplifier 28 amplifies the changed signal and delivers the changed signal to the control input of the further switch 19 resulting in switching the further switch 19 in an open state disconnecting the second supply 15 from the sense resistor 18. Thus, the erasing process of the predetermined memory cell may stop before the further control circuit 30 stops the erase signal. As a result the erasing process is stopped after the predetermined memory cell 1 attains an erased state.

Figure 5:
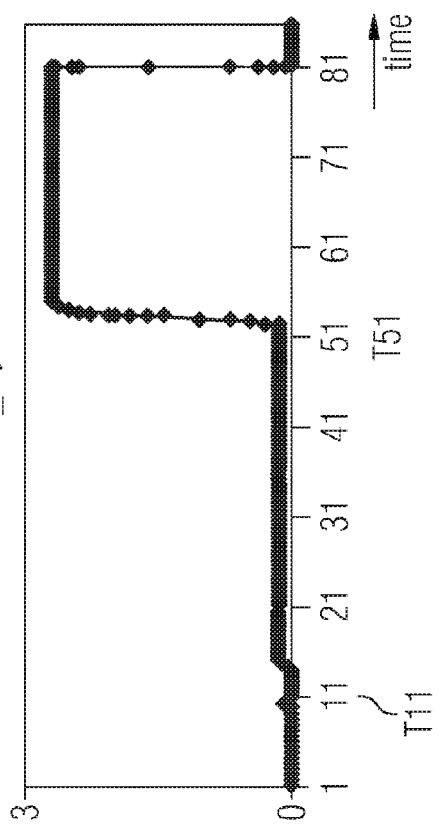
FIG. 5 depicts a diagram of an erase signal according to one embodiment.
Figure 7:
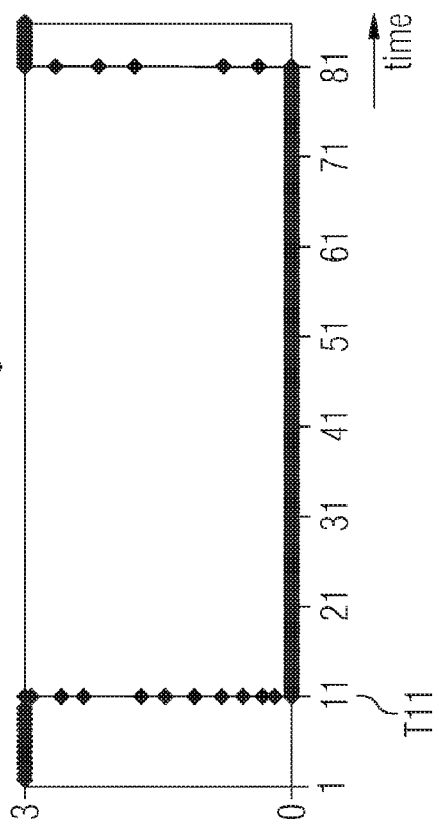
FIG. 7 depicts a diagram of a control signal according to one embodiment.
Figure 6:
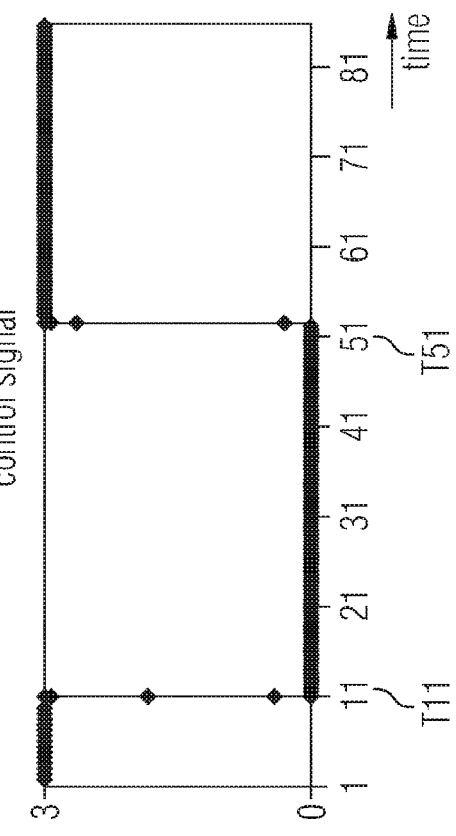
FIG. 6 depicts a diagram of a comparator output signal according to one embodiment.

FIG. 5 depicts the erase signal that is delivered by the further control circuit 30 to the fourth input 27 of the second comparator 26 according to one embodiment. FIG. 6 depicts the output signal of the comparator 20 that is delivered on the output 24 according to one embodiment. FIG. 7 depicts the control signal of the amplifier 28 that is delivered to the further switch 19 according to one embodiment. It can be seen from FIG. 5 that at a start time point T11 the further control circuit 30 puts out a low signal to the fourth input 27. At the same time the control signal changes from a high voltage state to a low voltage state at the start time point T11 (FIG. 7). This results in switching the further switch 19 from an open state to a closed state resulting in an electrical connection between the second supply 15 and the predetermined memory cell 1 as explained above. The result is an erasing current that flows through the predetermined memory cell that is in a low resistance state resolving the conducting link between the anode 2 and the cathode 3. Because of the erasing current, a voltage difference is generated between the first and the second inputs 21, 22 of the comparator 20 holding the output signal of the comparator 20 in a low voltage state. The output signal of the comparator 20 is from the beginning in a low voltage state as it is depicted in FIG. 6.

In the depicted embodiment the predetermined memory cell 1 attains a high resistance state at the third time point T51. Because of the high resistance state of the memory cell the current stops and the voltage on the sense resistor 1 decreases and the difference between the first and the second inputs 21, 22 is reduced. This results in a changing of the output signal of the first comparator 20 at the third time point T51 as depicted in FIG. 6. The change from the low voltage to a high voltage output signal of the output 24 results in a change of the output signal of the second comparator 26 and leads therefore to a high voltage level of the control signal at the third time point T51 as depicted in FIG. 7. The high voltage of the control signal switches a further switch 19 to an open state disconnecting the common line 17 from the second supply 15.

The further switch 19 may be embodied for example as a PMOS transistor as depicted in FIG. 4. However, also other types of switches or other types of transistors may be used for providing the further switch 19.

In a further embodiment, the select unit 13 delivers a high voltage control signal on several select lines 12, 45, 46 that results in switching switches 7 of different rows 40, 43, 44 in a current state. Thus it is possible to erase several memory cells 1 at the same time using the control circuit 14.

Depending on the position of the memory cells 1 that are connected with the common line 17, the different memory cells 1 may attain the erased state at different times. The erase process is started, as discussed above, by applying an erase signal on the fourth input 27 by the further control circuit 30. If there are memory cells 1 that are in a low resistance state and that are electrically connected with the common line 17, then an erase current flows through the sense resistor 18. The current causes a voltage drop on the sense resistor 18 resulting in a low output voltage of the first comparator 20 and resulting in a continuation of the erasing process. After the last memory cell attains the high resistance state, then no current flows via the sense resistor 18 and the voltage on the common line 17 and the voltage of the second supply 15 become equal resulting in a high output signal of the first comparator 20. The high output signal of the first comparator 20 results in a switching of the further switch 19 as explained above. Thus it is possible to control the time during which an erase voltage is applied to at least one memory cell or a group of memory cells individually as long as it is necessary to switch all the predetermined selected memory cells 1 in a high resistance state. Therefore, it is not necessary to know exactly the number of memory cells that are in a low resistance state or that are in a high resistance state to determine the time during which the further control circuit 30 applies an erasing signal to the fourth input 27 precisely. Thus, it is possible to provide a self control of the stopping of the erasing independent from the further control circuit 30.

If several memory cells are erased at the same time, whereby the memory cells are arranged at different distances to the second supply 15, then the erase current for each memory cell 1 is limited and predetermined by the respective switch 7 of the memory cell 1. The smallest current flows through memory cells that are arranged at the greatest distance referred to the control circuit 14.

In one embodiment the erase current may be 8 μA and referring to −80 mV erasing voltage for a resistance of 10 kΩ of the memory cell. More current flows through the memory cells that are arranged nearby the control circuit 14 because the drain-source voltage of the transistor that is arranged as a switch 7 is larger than for the memory cells that are arranged at a greater distance to the control circuit 14. This refers to the resistance of the common line 17 and the resistance of the first conducting line 9. In this embodiment the greatest current is about 10.5 μA referring to an erasing voltage of −105 mV. If some of the selected memory cells are switched in a high resistance state, then the current through the sense resistor 18 decreases and the voltage on the common line 17 increases. This results in a higher current through the remaining selected memory cells that are in a low resistance state.

Lower difference between the erasing currents of different selected memory cells are attained if a group of neighbored memory cells is selected. Thus, this results in lower voltage difference between the drain connections of transistors that may be used as switches 7. The sense resistor may have a value between 0.5 and 1 kΩ, which may be provided by a gate source resistor of the transistor. The memory with the programmable memory cells may be arranged with further memory circuits with programmable memory cells on a memory module. Furthermore the memory circuit with the programmable memory cells may be integrated in a data system that may comprise at least one or several memory devices or memory modules. The data system may comprise a memory controller that is connected with the at least one memory device.

FIG. 8 illustrates a data system 54 with a first input/output 55 that is connected with a memory controller 50 according to one embodiment. The memory controller 50 is electrically connected with a memory module 51. The memory module 51 comprises a first memory device 52 and a second memory device 53. The first and the second memory devices 52, 53 comprise memory circuits with programmable memory cells (not illustrated) as explained referring to FIG. 4. The first and the second memory devices 52, 53 may be embodied as DRAM memories. The memory controller 50 is electrically connected by control lines with a control input/output 56 of the memory module 51. The control input/output 56 is electrically connected with the first and the second memory devices 52, 53. The memory module 51 furthermore comprises a data input/output 57. The data input/output 57 is connected by data lines with the first and the second memory devices 52, 53. The data input/output 57 is furthermore electrically connected by further data lines with a second input/output unit 58 of the data system 54. The data system 54 may be used for storing data in the first and the second memory devices 52, 53. The storing and providing of data may be controlled by the memory controller 50. The memory controller 50 may receive control commands by the first I/O unit 55. Depending on the received control commands, the memory controller 50 controls storing, erasing or reading data of the first and/or the second memory 52, 53. The data that are stored in the first and the second memory 52, 53 are delivered by the second I/O unit 58 and the data I/O unit 57 to or from the first and/or the second memory 52, 53.

The data system may be for example part of a personal computer or part of the data processing machine.

Figure 9:
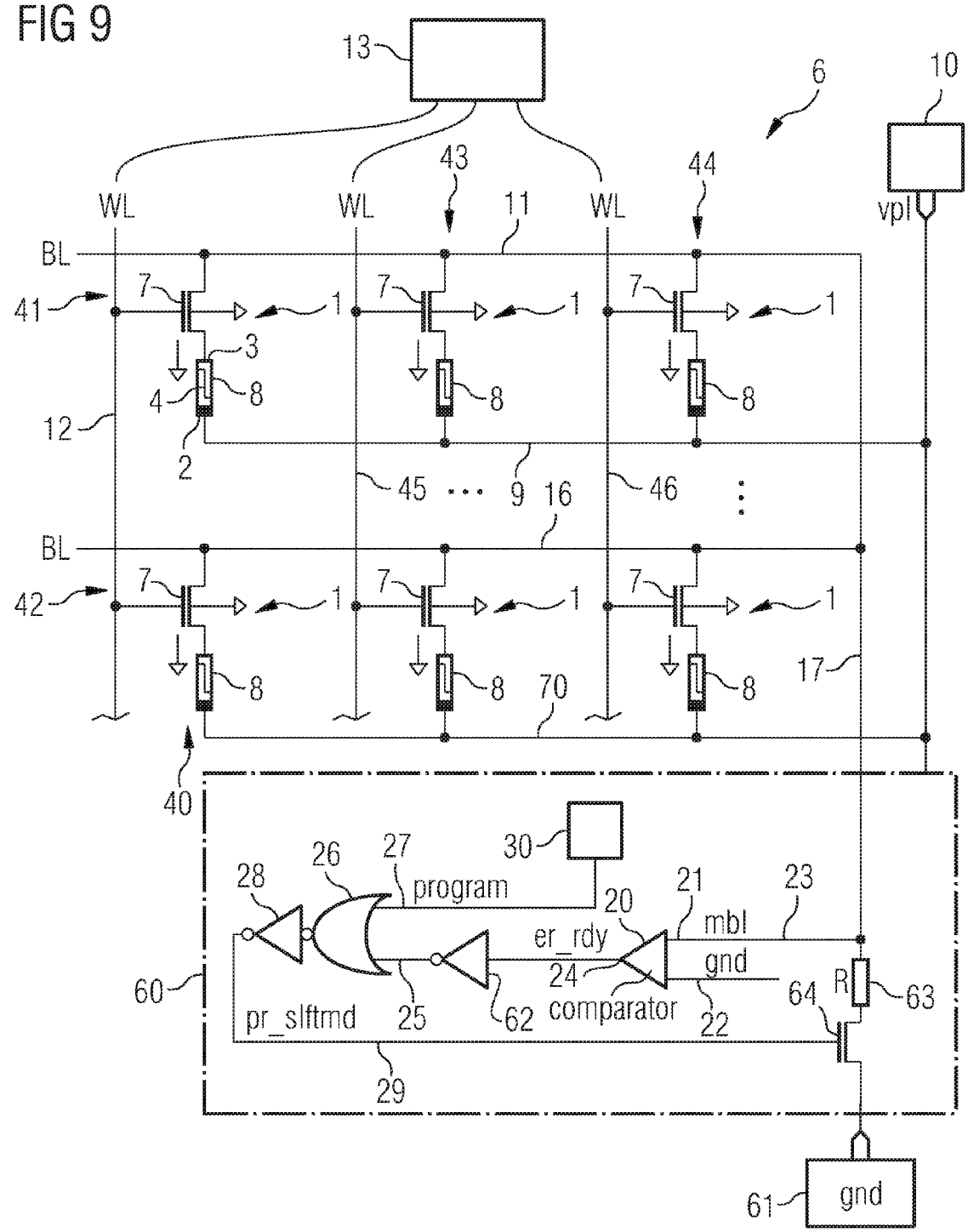
FIG. 9 depicts a further embodiment of a memory circuit according to one embodiment.

FIG. 9 depicts a schematic partial view of an integrated circuit 6 that is embodied as a memory circuit with several memory cells 1 according to one embodiment. Each of the memory cells 1 comprises a switch 7 and a memory element 8 with an anode 2, cathode 3 and a programmable layer 4 in between as explained in FIG. 1. The anode 2 is connected by a first conducting line 9 with a first electrical supply 10. The switch 7 is disposed between the cathode 3 and a second conducting line 11. The switch 7 is connected via a control input with a select line 12. The select line 12 is connected with a select unit 13.

The second conducting line 11 is connected with a further control circuit 60. The further control circuit 60 is connected with a further second supply 61. The memory cell 1 is therefore connected via the switch 7 with the first conductor which is connected with the first supply 10 and via the further control circuit 60 with the second conductor which is connected with the further second supply 61. The first supply 10 delivers a first electrical potential to the anode 2 of the memory cell 1. The further second supply 61 delivers a third electrical potential, i.e. a third voltage. Depending on the switching position of the switch 7 the cathode 3 is connected with or disconnected from the second conducting line 11. If the switch 7 is controlled by a select signal on the select line 12 in a closed position, then the second conducting line 11 is electrically connected with the cathode 3. Depending on the embodiment, several types of switches may be used, for example a transistor may be used as a switch 7.

In the depicted embodiment several memory cells 1 are arranged in rows 40, 43, 44 and columns 41, 42, whereby the switches 7 of the memory cells 1 of one row 40, 43, 44 are connected via control inputs with one select line 12, 45, 46. Furthermore, the memory cells 1 of a first column 41 are electrically connected via the switches 7 with one second conducting line 11. The memory cells of the second column 42 are electrically connected via switches 7 with a further conducting line 16. The anodes 2 of the memory elements 8 of the memory cells 1 of the second column 42 are connected with a third conducting line 70 that is connected with the first supply 10. The second conducting line 11 and the further conducting line 16 are connected with a common line 17 that is connected with the further control circuit 60. In the depicted embodiment, the further control circuit 60 comprises a further sense resistor 63 that is connected with the common line 17 and via a further second switch 64 with the further second supply 61. The further second switch 64 may be for example embodied as a transistor for example an N-MOS transistor. The further control circuit 60 comprises a first comparator 20 with a first and a second input 21, 22. The first input 21 is electrically connected by a sense line 23 with the common line 17. An output 24 of the first comparator 20 is connected with an input of a further amplifier 62. An output of the further amplifier 62 is connected with a third input 25 of a second comparator 26. The second comparator 26 comprises a fourth input 27, to which a program signal is supplied by a further control circuit 30. An output of the second comparator 26 is connected with an input of an amplifier 28. An output of the amplifier 28 is connected via a second control line 29 with a control input of the further second switch 64.

The second input 22 of the first comparator 20 may be electrically connected with the further second supply 61 delivering a third voltage that is provided by the further second supply 61. The electrical potential of the further second supply 61 is lower than the electrical potential of the first supply in this embodiment. The further second supply 61 may, for example, deliver an electrical ground potential. This embodiment refers to a write process during which a program state is programmed in the at least one predetermined memory cell 1 by applying a lower voltage at the cathode 2 in comparison to the anode 2. The difference between the potential of the further second supply 61 and the first supply 10 may be in the range between 0.25 V and 0.30 V. Depending on the used embodiment, the further second supply 61 and the second supply 15 may be embodied as controllable voltage sources that can change its electrical potential depending on writing a program state in the memory element or erasing a program state of the memory element.

Figure 10:
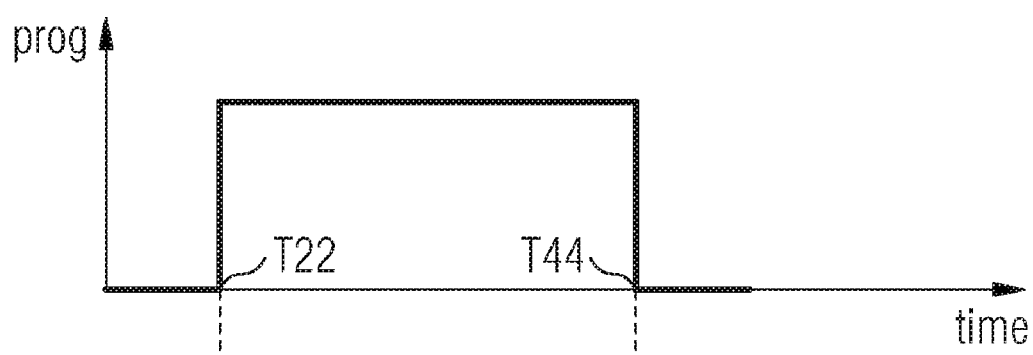
FIG. 10 depicts a diagram of a control signal according to one embodiment.

In the following, the function of the integrated circuit 6 is explained for a writing process. If a program state may be written in a predetermined memory cell 1, then the select unit 13 delivers a select signal on the select line 12 that is electrically connected with a control input of the switch 7 of the predetermined memory cell 1. The select signal puts the switch 7 from an open to a closed state. In an open state of the switch 7 the cathode 3 is disconnected from the second conducting line 11. In a closed state of the switch 7, the cathode 3 of the predetermined memory cell 1 is electrically connected with the second conducting line 11. Furthermore, a program signal is delivered by the further control circuit 30 to the fourth input 27 of the second comparator 26. The first supply 10 provides a higher voltage potential compared to the further second supply 61. Furthermore, the further second switch 64 is in a closed position electrically connecting the further second supply 61 via the further sense resistor 63 with the common line 17 and the second and further conducting lines 11, 16. The program signal is generated by the further control circuit 30 and the time duration of the program signal is also controlled by the further control circuit 30. The program signal is for example a high voltage signal. FIG. 10 depicts the program signal that starts at a further first time T22 according to one embodiment.

Figure 11:
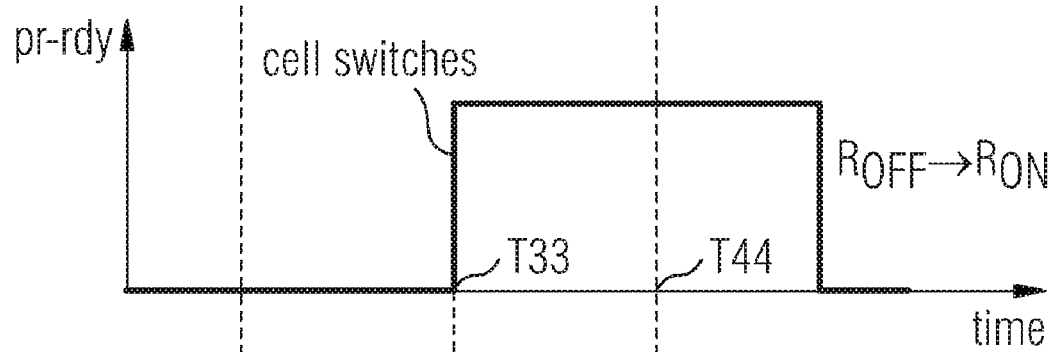
FIG. 11 depicts a diagram of a comparator output signal according to one embodiment.
Figure 12:
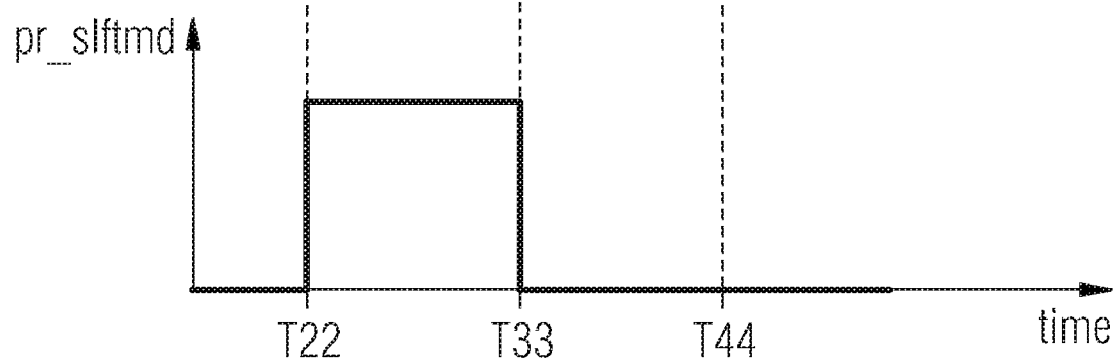
FIG. 12 depicts a diagram of a control signal according to one embodiment.

If the predetermined memory cell 1 is in a state with a high electrical resistance, then nearly no current flows from the further second supply 61 via the further second switch 64 and the further sense resistor 63, the common line 17 and the second conducting line 11, the switch 7 and the predetermined memory cell 1 and a first conducting line 9 to the first supply 10. Therefore no voltage drop arises on the further sense resistor 63. This means that the output 24 of the comparator 20 stays on a predetermined level, in this embodiment on a low voltage level. Some time after changing the resistance of the memory element from a high resistance state to a low resistance state at a further second time point T33, as illustrated in FIG. 11, the current increases as a result of generating a conductive link 5 from the anode 2 to the cathode 3. The increasing current generates a voltage drop on the further sense resistor 63 that generates a voltage difference between the first and the second signal input of the first comparator 20. This means that the output 24 of the comparator 20 changes at the further second time point T33 from the predetermined level to another level, in this embodiment to a high voltage level as depicted in FIG. 11. FIG. 12 shows the control signal of the amplifier 28 over the time, whereby between the further first time point T22 and the further second time point T33 the control signal of the amplifier is 28 at a high voltage level according to one embodiment. The high voltage level on the control input of the further second switch closes the further second switch 64 that means puts the further second switch in a current state electrically connecting the further second supply 61 with the further sense resistor 63.

The further sense resistor 63 may be identical to the sense resistor 18. However, depending on the used embodiment, the further sense resistor 63 may have a different resistance value. Instead of a simple resistor, the further sense resistor 63 may be embodied as an electrical circuit, for example a transistor that delivers a voltage drop across the electrical circuit.

The further amplifier 62 amplifies and inverts the output signal of the comparator 20 and delivers the inverted output signal to a third input of the second comparator 26.

The second comparator 26 may be embodied as a logical gate that puts out a high voltage signal to the amplifier 28 if the third and the fourth input show a low voltage signal. The output of the second comparator 26 is amplified by the amplifier 28 and delivered via the second control line 29 to the control input of the further second switch 64.

FIG. 12 depicts the output signal of the amplifier 28 on the control line 29. If the third and the fourth input of the second comparator 26 are on the same voltage level, then the further second switch 64 is controlled by the control signal in a current state electrically connecting the further second supply 61 with the further sense resistor 63. As long as the output 24 of the first comparator 20 indicates a low current over the further sense resistor 63 that means at least no or only a small voltage difference between the further second supply 61 and the common line 17, then the further second switch 64 remains in a current position and the writing process of the predetermined memory cell is continuing.

If the predetermined memory cell changes to a low resistance state, then the current via the further sense resistor 63 increases and the voltage on the common line 17 and the voltage of the further second supply 61 become different. If the voltage on the common line 17 and the voltage of the further second supply 61 differ more than a predetermined value, then the voltage signal of the output 24 changes from a low to a high voltage level at the further second time T33. The high voltage level of the output signal is amplified and inverted by the further amplifier 62 and detected by the second comparator 26. The output signal of the second comparator 26 changes. The amplifier 28 amplifies the changed signal and delivers the changed signal to the control input of the further second switch 64 resulting in switching the further second switch 64 in an open state disconnecting the further second supply 61 from the further sense resistor 63. Thus, the writing process of the predetermined memory cell may stop before the further control circuit 30 stops the program signal at a further third time point T44 as depicted in FIG. 10. As a result, the writing process is stopped after the predetermined memory cell 1 attains a program state that means a state with a low resistance.

The provision of the sense resistor 18 and the further sense resistor 63 allows sensing the current that flows during a change of the state of the memory cells 1 during erasing a state or writing a state in the memory cells 1. In another embodiment, other means might be used for sensing the current flow to detect whether the memory cell changed from one state to another to stop the current flow. The function of the control circuit 14 and the further control circuit 60 is to sense whether an erasing or writing process is finished. For detecting the finish of an erasing or writing, the current to the memory cell is monitored. Depending on the change of the current, the change of the state of the memory cell is deleted. The current may be monitored by a voltage drop on a sense means, for example a resistor or a transistor that is arranged in the current flow to the memory cell.

The discussed integrated circuit may address the problem that a voltage drop across a memory cell that is too high or that may endure too long may damage the memory cell. Especially for a memory element it may be useful to limit a voltage drop and/or to limit a time duration for a voltage drop. Furthermore, the discussed integrated circuit may address the controlling of a voltage, for example the duration and/or the value of the voltage. Another aspect of the integrated circuit may refer to a protection circuit against a damaging voltage with respect to value and/or duration of a voltage that is applied on a memory cell.

While the foregoing is directed to embodiments of the present invention, other and further embodiments of the invention may be devised without departing from the basic scope thereof, and the scope thereof is determined by the claims that follow.

What is claimed is:

1. An integrated circuit, comprising:
a plurality of programmable memory cells arranged between a first and a second conducting line for supplying a first and second voltage, respectively;
a sense resistor coupled to the memory cells; and
a control circuit being arranged between the memory cells and the second conducting line; wherein the control circuit is configured to control a time during which at least one of the memory cells is supplied with current from the second conducting line, thereby changing a state of the memory cell; and wherein the control circuit is configured to sense the state of the memory cell and to stop the current upon sensing that the memory cell is transferred to a changed state, the control circuit comprising a switch configured to stop the current on the second conducting line, wherein the switch is activated based on at least in part a voltage drop across the sense resistor.

2. The integrated circuit of claim 1, wherein changing is erasing a state of the memory cell.

3. The integrated circuit of claim 1, wherein changing is writing a state in the memory cell.

4. The integrated circuit of claim 1, wherein the control circuit is configured to use the voltage drop across the sense resistor to sense an electrical current flowing to the memory cell during the changing of the state of the memory cell, and wherein the control circuit is configured to stop the current if the current decreases below a given level.

5. The integrated circuit of claim 1, wherein the control circuit is configured to use the voltage drop across the sense resistor to sense an electrical current flowing to the memory cell during the changing of the state of the memory cell, and wherein the control circuit is configured to stop the current if the current increases above a given level.

6. The integrated circuit of claim 1, wherein the sense resistor is arranged between the memory cell and the switch, wherein the control circuit is connected with the sense resistor and is configured to sense a voltage drop across the sense resistor, and wherein the control circuit is configured to stop the current using the switch if the voltage drop decreases to a predetermined level.

7. The integrated circuit of claim 6, further comprising:
a first comparator circuit with a first input and a second input; the first input being connected with the second conducting line for supplying the second voltage; wherein the second input is connected with a connecting line that connects the sense resistor with the memory cell, wherein the first comparator circuit is configured to compare voltages of the first and the second input and to provide a first control signal via an output to the control circuit if the voltage of the first input is nearly the same value as the voltage of the second input, and the control circuit is configured to stop the current to the memory cell after receiving the first control signal.

8. The integrated circuit of claim 7, further comprising:
a second comparator circuit with a first input and a second input, wherein the first input is connected with a second control signal, wherein the second input is connected with the first control signal, wherein an output of the second comparator is connected with a control input of the switch, and wherein the second comparator is configured to control the switch depending on values of the first and second control signals.

9. The integrated circuit of claim 1, wherein the switch is arranged between the memory cell and a power source supplying the second voltage, wherein the switch is connected with the control circuit, and wherein the control circuit is configured to control the switch based on the voltage drop to start and to stop a current to the memory cell.

10. The integrated circuit of claim 1, further comprising:
a plurality of memory cells that are arranged in parallel between the first conducting line and a supply line, wherein at least two memory cells are connected via the supply line with the second conducting line to supply the second voltage, wherein the control circuit is connected with the second conducting line to supply the second voltage, wherein the control circuit is configured to control a time during which the two memory cells are supplied with a current from the second conducting line, thereby changing the program states of the memory cells, and wherein the control circuit is configured to sense a program state of the memory cells and to stop the current when the at least two memory cells attain a changed program state.

11. The integrated circuit of claim 10, further comprising:
two bit lines, wherein each of the two bit lines are connected with a plurality of memory cells, and wherein the bit lines are connected with the supply line.

12. The integrated circuit of claim 1, wherein the control circuit comprises:
a first comparator configured to detect the voltage drop across the sense resistor; and
a second comparator with a first and second input, the first input being connected to an output of the first comparator and the second input receiving a state-change signal, wherein an output of the second comparator circuit controls the switch.

13. A system with a memory circuit with programmable memory cells which are arranged between a first and a second conducting line for supplying a first and a second voltage, respectively, comprising:
a sense resistor coupled to the memory cells; and
a control circuit connected with the second conducting line, wherein the control circuit is configured to control a time during which at least one of the memory cells is supplied with current from the second conducting line, thereby changing a state of the memory cell, and wherein the control circuit is configured to sense the state of the memory cell and to stop the current upon sensing that the memory cell is in a changed state, the control circuit comprising a switch configured to stop the current on the second conducting line, wherein the switch is activated based on at least in part a voltage drop across the sense resistor.

14. The system of claim 13, wherein the first conducting line supplies a plate potential and the second conducting line supplies an erase potential to the memory cells.

15. The system of claim 13, wherein the control circuit is configured to sense an electrical current flowing to the memory cell during the changing of the program state of the memory cell, and wherein the control circuit is configured to stop the current if the current decreases below a predetermined level.

16. The system of claim 13, wherein the control circuit is configured to use the voltage drop across the sense resistor to sense an electrical current flowing to the memory cell during the changing of the program state of the memory cell, and wherein the control circuit is configured to stop the current if the current increases above a predetermined level.

17. The system of claim 13, wherein the sense resistor is arranged between the memory cell and a power source supplying the second voltage, wherein the control circuit is connected with the sense resistor and is configured to sense a voltage drop on the sense resistor, and wherein the control circuit is configured to stop the current if the voltage drop decreases to a predetermined level.

18. The system of claim 16, further comprising:
a first comparator circuit with a first input and a second input, wherein the first input is connected with a second conducting line to supply a second voltage, wherein the second input is connected with a connecting line that connects the sense resistor with the memory cell, wherein the first comparator circuit is configured to compare voltages of the first and the second input and to provide a first control signal via an output to the control circuit if the voltage of the first input is nearly the same value as the voltage of the second input, and wherein the control circuit is configured to stop the current to the memory cell after receiving the first control signal.

19. The system of claim 17, further comprising:
a second comparator circuit with a first input and a second input, wherein the first input is connected with a second control signal, wherein the second input is connected with the first control signal, wherein an output of the second comparator is connected with a control input of the switch, and wherein the second comparator is configured to control the switch depending on values of the first and second control signals.

20. The system of claim 13, wherein the switch is arranged between the memory cell and a power source supplying the second voltage, wherein the switch is connected with the control circuit, and wherein the control circuit is configured to control the switch based on the voltage drop to start and to stop a current to the memory cell.

21. The system of claim 13, further comprising:
a plurality of memory cells that are arranged in parallel between the first conducting line and a supply line, wherein at least two memory cells are connected via the supply line with the second conducting line, wherein the control circuit is connected with the second conducting line, wherein the control circuit is configured to control a time during which the at least two memory cells are supplied with an erasing current from the second conducting line, thereby changing program states of the memory cells, and wherein the control circuit is configured to sense the program states of the memory cells and to stop the current when the at least two memory cells attain a changed state.

22. The system of claim 13, wherein the control circuit comprises:
a first comparator configured to detect the voltage drop across the sense resistor; and
a second comparator with a first and second input, the first input being connected to an output of the first comparator and the second input receiving a state-change signal, wherein an output of the second comparator circuit controls the switch.

* * * * *